(12) United States Patent
Lee (10) Patent No.: US 7,155,267 B2
(45) Date of Patent: Dec. 26, 2006

(54) APPARATUS AND METHOD FOR MONITORING ANTENNA STATE OF MOBILE STATION

(75) Inventor: Chang-Kyu Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 98 days.

(21) Appl. No.: 10/780,939

(22) Filed: Feb. 19, 2004

(65) Prior Publication Data

US 2004/0166909 A1 Aug. 26, 2004

(30) Foreign Application Priority Data

Feb. 25, 2003 (KR) ............. 10-2003-0011662

(51) Int. Cl.
*H04M 1/00* (2006.01)
(52) U.S. Cl. ............. 455/575.7; 455/9; 455/67.11; 455/68; 455/115.1; 455/115.4; 455/129; 455/423; 343/751; 343/876; 343/893; 343/894
(58) Field of Classification Search ............. 455/9, 455/13.3, 26.1, 63.4, 67.11, 68, 82, 115.1, 455/115.4, 121, 123, 129, 193.1, 226.1, 423, 455/562.1, 550.1, 575.7; 343/703, 711, 751, 343/893, 894, 876; 342/173, 423, 444
See application file for complete search history.

(56) References Cited

U.S. PATENT DOCUMENTS

| 4,633,519 | A | * | 12/1986 | Gotoh et al. ............. 455/277.2 |
| 5,144,250 | A | * | 9/1992 | Little ............. 324/533 |
| 5,373,826 | A | * | 12/1994 | Taruya et al. ............. 123/634 |
| 5,497,125 | A | * | 3/1996 | Royds ............. 330/290 |
| 5,903,422 | A | * | 5/1999 | Hosokawa ............. 361/93.1 |
| 6,064,269 | A | * | 5/2000 | Ruppel et al. ............. 330/297 |
| 6,114,955 | A | * | 9/2000 | Brunius et al. ............. 340/539.24 |
| 6,118,409 | A | | 9/2000 | Pietsch et al. ............. 343/703 |
| 6,226,496 | B1 | * | 5/2001 | Yajima ............. 455/63.1 |
| 6,275,194 | B1 | * | 8/2001 | Ansorge ............. 343/713 |
| 6,297,780 | B1 | * | 10/2001 | Kirisawa ............. 343/703 |

(Continued)

FOREIGN PATENT DOCUMENTS

CN 1269635 10/2000

(Continued)

OTHER PUBLICATIONS

Japanese Office Action dated Jul. 18, 2006.

*Primary Examiner*—William Trost
*Assistant Examiner*—James Ewart
(74) *Attorney, Agent, or Firm*—Fleshner & Kim, LLP (57) ABSTRACT

An apparatus and method are provided for monitoring an antenna state of a mobile station. A resister may be provided between a battery voltage terminal and a power source voltage terminal of a power amplifier. A voltage level corresponding to a dropped amount of a voltage due to the resister may be generated and compared with a previously stored voltage level to determine whether current consumption of the power amplifier has been increased. If the increased amount of the current consumption of the power amplifier is large, the currently connected antenna may be determined to be in an abnormal state and a transmission path may be switched to another antenna. If two antennas provided in the mobile communication are in an electrically abnormal state, a baseband chip may inform a user of the abnormal state of the antenna. Accordingly, an output level degradation generated when the antenna is operated in an electrically abnormal state and shortening of the life span of a battery can be prevented. Thus, performance of an output terminal can be enhanced.

19 Claims, 8 Drawing Sheets

U.S. PATENT DOCUMENTS

| | | | |
|---|---|---|---|
| 6,348,801 B1 * | 2/2002 | Pietsch | 324/534 |
| 6,380,748 B1 * | 4/2002 | Kang et al. | 324/645 |
| 6,407,639 B1 * | 6/2002 | Jean et al. | 330/298 |
| 6,437,577 B1 * | 8/2002 | Fritzmann et al. | 324/523 |
| 6,633,750 B1 * | 10/2003 | Dacus et al. | 455/126 |
| 6,690,366 B1 * | 2/2004 | Kitahashi | 345/211 |
| 6,928,281 B1 * | 8/2005 | Ward et al. | 455/423 |
| 2001/0041595 A1 * | 11/2001 | Ikeda et al. | 455/562 |

FOREIGN PATENT DOCUMENTS

| | | |
|---|---|---|
| CN | 1285964 | 2/2001 |
| EP | 1 055 931 A2 | 5/2000 |
| EP | 1 215 823 A3 | 3/2003 |
| JP | 64-060027 | 3/1989 |
| JP | 09-148958 | 6/1997 |
| JP | 10/267978 | 10/1998 |
| JP | 2000/134131 | 5/2000 |
| JP | 2000/295055 | 10/2000 |
| JP | 2001/308739 | 11/2001 |
| JP | 2002-261522 | 9/2002 |
| WO | WO 9119348 A1 * | 12/1991 |
| WO | WO 9519574 A1 * | 7/1995 |

* cited by examiner

| INPUT LEVEL | OUTPUT LEVEL(dBm) | CONSUMED CURRENT(mA) | VOLTAGE OF TERMINAL B | VOLTAGE OF TERMINAL A | VOLTAGE OF TERMINAL C |
|---|---|---|---|---|---|
| 0 | 21.9 | 201 | 3.38995 | 3.4 | 0.201 |
| 2 | 23.65 | 244 | 3.3878 | 3.4 | 0.244 |
| 4 | 24.98 | 289 | 3.38555 | 3.4 | 0.289 |
| 6 | 25.68 | 327 | 3.38365 | 3.4 | 0.327 |

FIG. 8

| INPUT LEVEL | OUTPUT TERMINAL MATCHING CHARACTERISTICS | OUTPUT LEVEL(dBm) | CONSUMED CURRENT(mA) | VOLTAGE OF TERMINAL B | VOLTAGE OF TERMINAL A | VOLTAGE OF TERMINAL C |
|---|---|---|---|---|---|---|
| 0 | 1 | 21.9 | 337 | 3.38315 | 3.4 | 0.337 |
| 2 | 2 | 18.6 | 477 | 3.37615 | 3.4 | 0.477 |
| 4 | 3 | 12.1 | 511 | 3.37445 | 3.4 | 0.511 |
| 6 | 4 | −0.9 | 275 | 3.38625 | 3.4 | 0.275 |

FIG. 9

| TERMINAL E | COMMUNICATION BAND SWITCH | TRANSMISSION PATH OF SIGNAL | VOLTAGE STATE OF TERMINAL C |
|---|---|---|---|
| 1 | ON | TERMINAL 3 → TERMINAL 5 | IF THE VOLTAGE OF TERMINAL C IS DIFFERENT FROM THE NORMAL STATE |
| 0 | OFF | TERMINAL 3 → TERMINAL 4 | IF VOLTAGE OF TERMINAL C IS SAME AS THE NORMAL STATE |

APPARATUS AND METHOD FOR MONITORING ANTENNA STATE OF MOBILE STATION

BACKGROUND OF THE INVENTION

The present disclosure claims priority from Korean Patent Application No. 11662/2003, filed Feb. 25, 2003, the subject matter of which is incorporated herein by reference.

1. Field of the Invention

Embodiments of the present invention may relate to a sending end of a mobile communication terminal. More particularly, embodiments of the present invention may relate to an apparatus and method for monitoring a state of an antenna of a mobile communication terminal.

2. Background of Related Art

A mobile station may provide both a second-generation mobile communication service and a third-generation mobile communication service. Multimode terminals may provide a multimedia service as well as a voice service and a data service.

Figure 1:
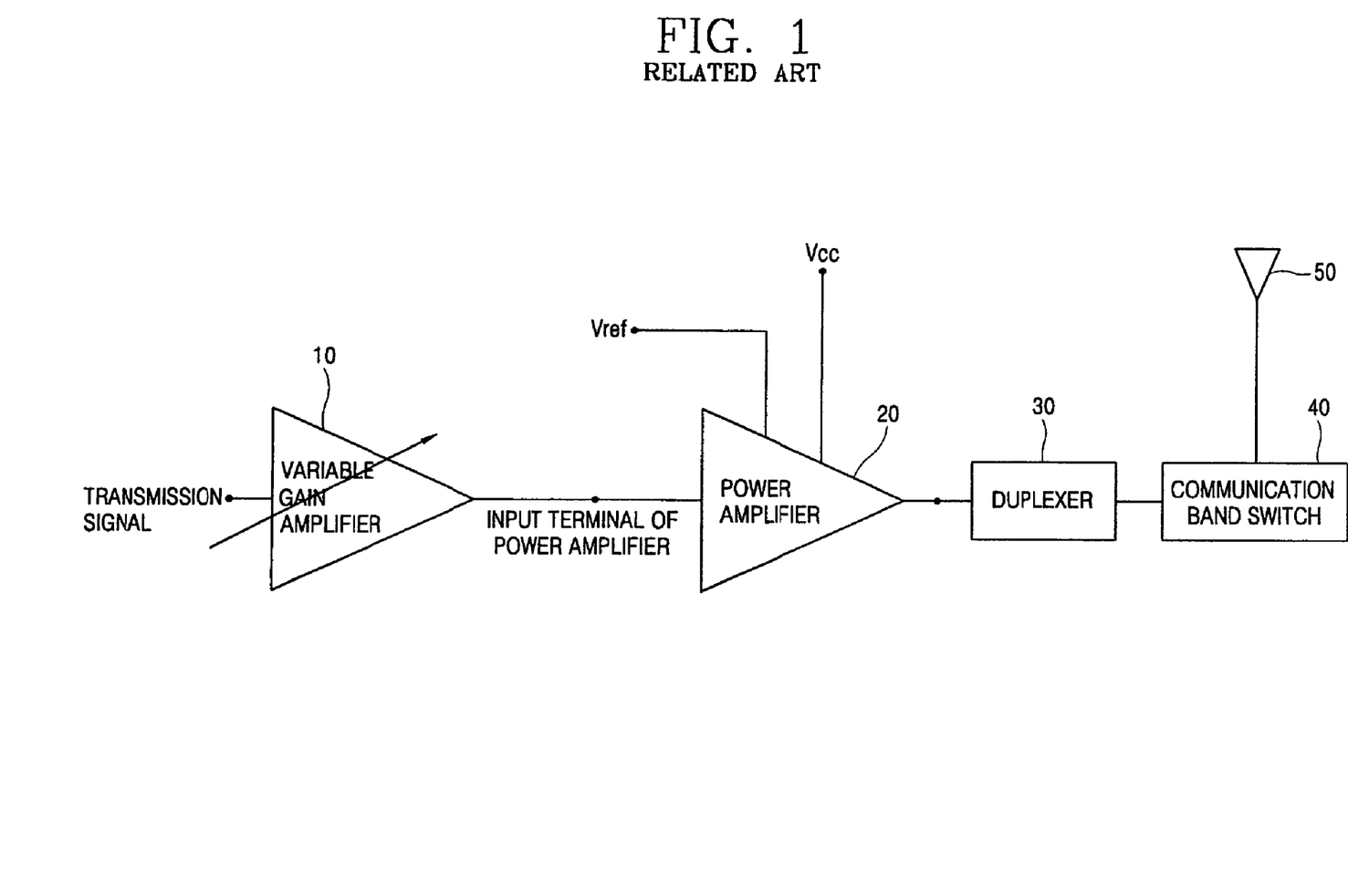
FIG. 1 illustrates a transmitter of a multimode mobile station according to an example arrangement.

FIG. 1 illustrates a transmitter of a multimode mobile station according to an example arrangement. Other arrangements are also possible. As shown in FIG. 1, the transmitter of the multimode mobile station may include a variable gain amplifier 10, a power amplifier 20, a duplexer 30, a communication band switch 40 and an external antenna 50. The variable gain amplifier 10 may vary an amplification gain of a transmission signal. The power amplifier 20 may power-amplify an output signal of the variable gain amplifier 10. The duplexer 30 may transmit the power-amplified transmission signal to a transmission path. The communication band switch 40 may output a Wideband Code Division Multiple Access (WCDMA) signal output from the duplexer 30 to an external antenna 50 and provide a transmission path of a GSM (Global System for Mobile communication) signal and a DSC (Digital Cellular Service) signal.

Figure 2:
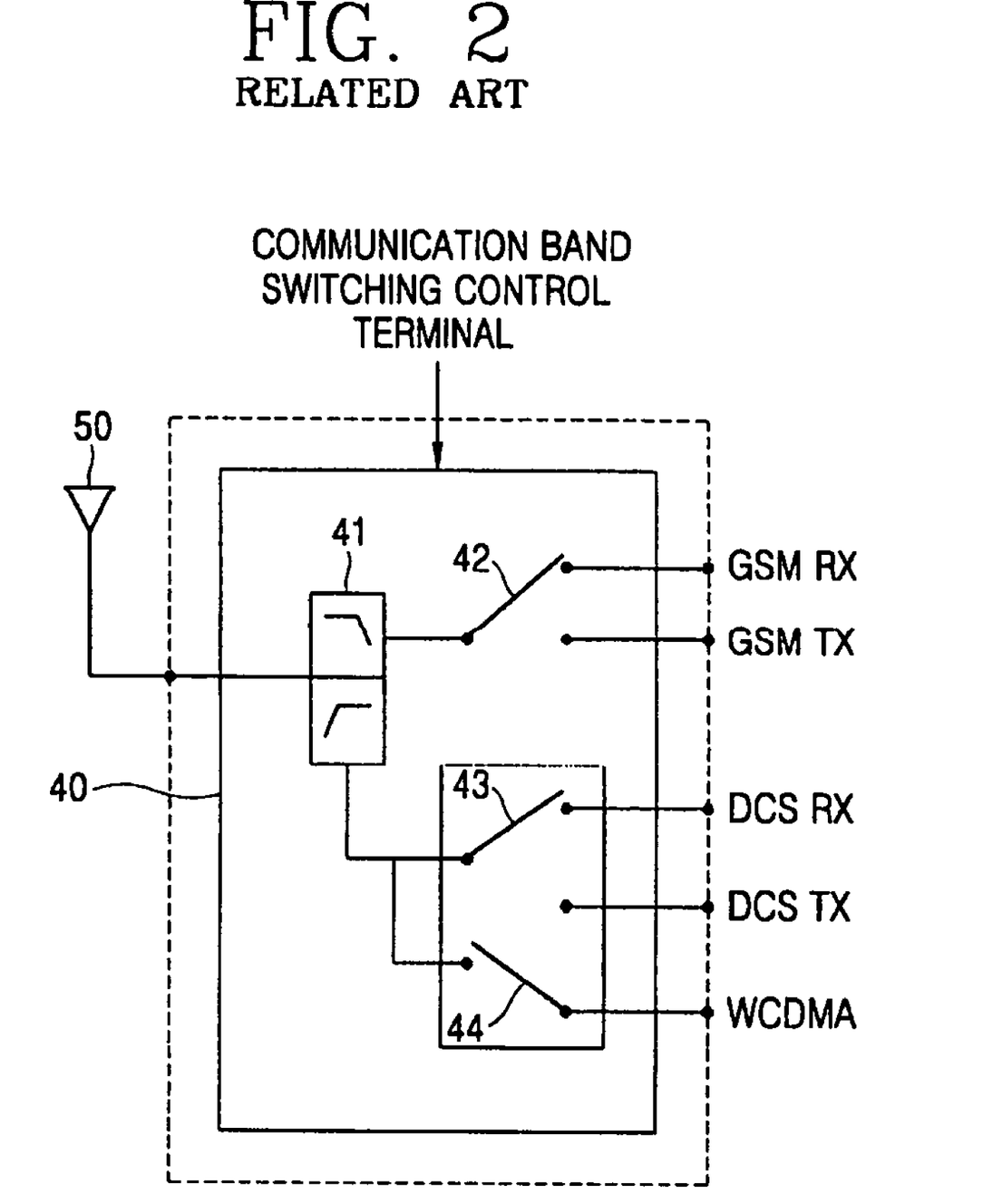
FIG. 2 illustrates a communication band switch according to an example arrangement.

FIG. 2 shows a communication band switch according to an example arrangement. Other arrangements are also possible. As shown, the communication band switch 40 includes a diplexer 41, a first switch 42, a second switch 43 and a third switch 44. The diplexer 41 may separate signals with different frequencies through low-pass filtering and high-pass filtering. The first switch 42 may transmit and receive the GSM signal by switching according to a band switching control signal input to a band switching control terminal. The second switch 43 may transmit and receive the DCS signal according to the band switching control signal. The third switch 44 may transmit the WCDMA signal by switching according to the band switching control signal.

The above-described transmitter of the multimode mobile station may operate as follows. The WCDMA transmission signal may be input to the power amplifier 20 through the variable gain amplifier 10. The power amplifier 20 may power-amplify the WCDMA transmission signal. The duplexer 30 may output the power-amplified WCDMA transmission signal to the external antenna 50 through the communication band switch 40.

An output level of the transmitter of the mobile station may be set by standards. Since the external antenna 50 protrudes outwardly from the terminal, the external antenna 50 may be easily broken or cracked, and thus, there is a high possibility that the antenna can be electrically malfunctioned. In such a case, an output level of the mobile station may be sharply degraded while a current consumption of the power amplifier 20 is considerably increased.

An increase in the current consumption of the power amplifier 20 may result in physical damage to elements that affect an output terminal matching, such as the duplexer 30, the communication band switch 40 and the external antenna 50. This may also shorten a life span of the battery of the mobile station.

Installation of an isolator in the mobile station may reduce the physical damage to the elements affecting the output terminal matching of the mobile station, but in this case, an isolator insertion loss may be inevitably made, causing more current consumption of the power amplifier than the mobile station without having the isolator and resulting in a shortening of the life span of the battery.

SUMMARY OF THE INVENTION

An object of the invention is to solve at least the above problems and/or disadvantages and to provide at least the advantages described hereinafter.

Embodiments of the present invention may provide an apparatus and method for monitoring an antenna (i.e., an antenna state) of a multimode mobile station capable of sensing degradation of antenna characteristics or damage of the antenna. This may allow the user to replace or stop using the problematic antenna.

Embodiments of the present invention may provide an apparatus and method for monitoring an antenna state of a mobile station capable of enhancing a performance of a transmitter and lengthening a life span of a battery. This may be provided by detecting an electrical malfunction of an antenna by sensing a current consumption amount of a power amplifier. Performance may be enhanced by switching to a normal antenna.

An apparatus may be provided for monitoring an antenna of a mobile station. This may include a current sensing circuit for sensing a current consumption amount of a power amplifier that amplifies a power of a transmission signal. A baseband chip may determine a malfunction of a first antenna according to an increase of the sensed current amount. The baseband chip may further control switching to a second antenna when the first antenna is electrically malfunctioned, and inform a user of antenna malfunction when the first and/or second antennas are malfunctioned. A communication band switch may selectively switch the transmission signal between the first and second antennas based on control of the baseband chip.

An apparatus for monitoring an antenna state of a mobile station may include a resister connected between a battery voltage terminal and a power source voltage terminal of a power amplifier to sense a current consumption amount of the power amplifier. A comparator may detect a voltage level corresponding to a dropped amount of voltage due to the resister. A baseband chip may determine that the antenna connected to a current transmission path is in an electrically malfunctioned state based on the detected voltage level.

A method may also be provided for monitoring an antenna state of a mobile station. This may include sensing a consumed amount of current of a power amplifier and checking whether the sensed amount of current comes within (or outside of) an allowance range for determining a normal state. A switch may be made to a preliminary antenna if the sensed amount of current does not come within (or is outside of) the allowance range.

The sensing may include measuring a dropped amount of voltage due to the resister provided between the battery voltage terminal and the power source voltage terminal of the power amplifier. A voltage level may be generated corresponding to the measured dropped amount of voltage.

The measurement of the dropped amount of voltage due to the resister may be made by connecting the battery voltage terminal to a non-inverted input terminal of a comparator and by connecting the power source voltage terminal of the power amplifier to an inverted input terminal of the comparator.

If the generated voltage level is greater by a predetermined value than a stored corresponding voltage level, then the antenna currently connected to the transmission path may be determined to be in an electrically malfunctioned state. The stored voltage level may be a value that has been measured and stored when the antenna is in a normal state.

The switching may include switching a transmission path to the preliminary antenna when the sensed amount of current does not come within the allowance range and the preliminary antenna is normally operated.

The switching may further include informing a user of a malfunction state of a current antenna and the preliminary antenna when the sensed amount of current does not come within the allowance range and the operation of the preliminary antenna is electrically abnormal. If the sensed amount of current comes within the allowance range, the current transmission path may be maintained.

Additional advantages, objects, features and embodiments of the invention may be set forth in part in the description that follows and in part will become apparent to those having ordinary skill in the art upon examination of the following or may be learned from practice of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 3:
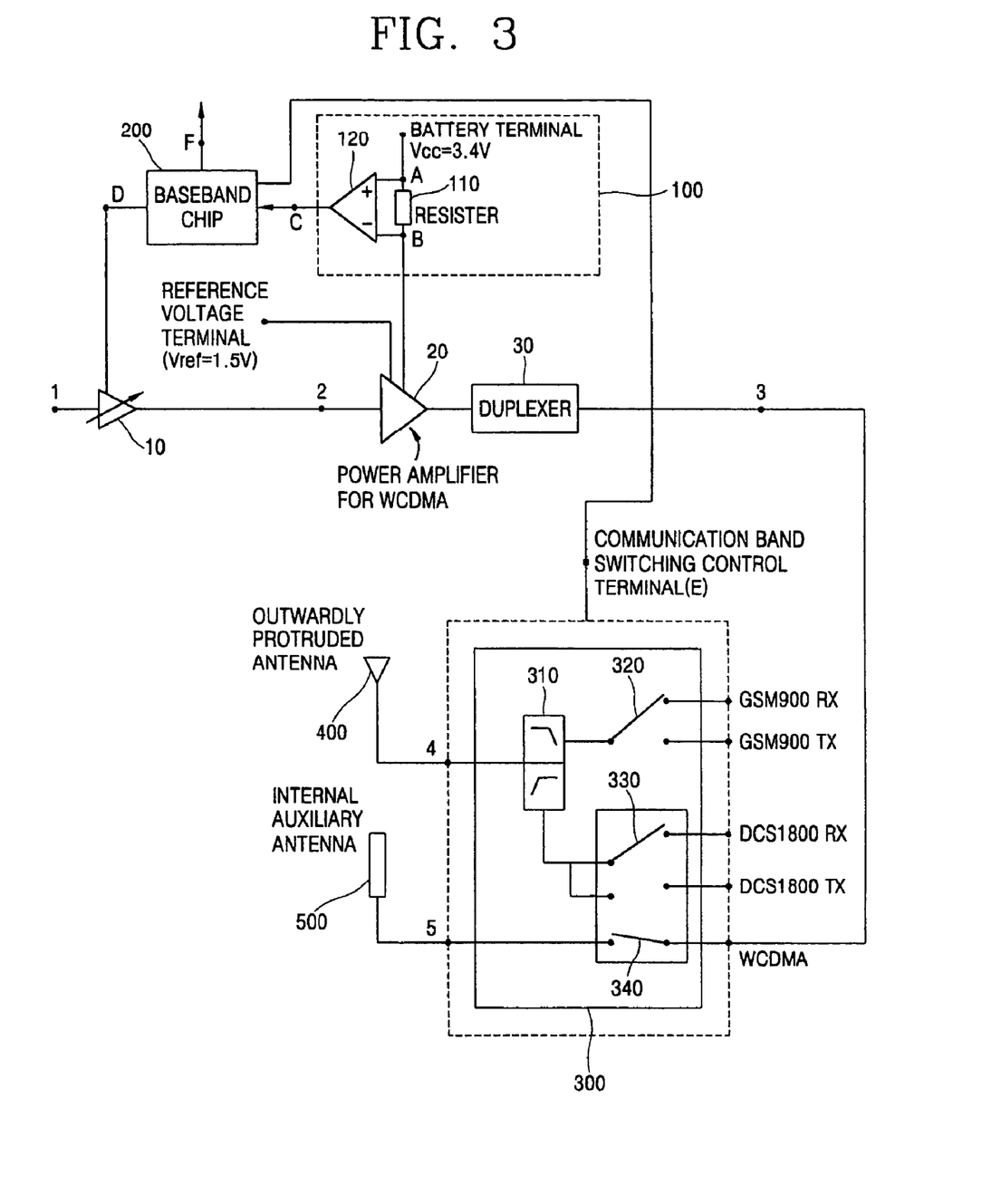
FIG. 3 illustrates an apparatus for monitoring an antenna state of a mobile station in accordance with an example embodiment of the present invention.

FIG. 3 illustrates an apparatus for monitoring an antenna state of a mobile station in accordance with an example embodiment of the present invention. Other embodiments and configurations are also within the scope of the present invention.

As shown in FIG. 3, the apparatus for monitoring an antenna state of a mobile station includes a variable gain amplifier 10, a power amplifier 20, a duplexer 30, a current sensing circuit 100, a baseband chip 200, and a communication band switch 300. The variable gain amplifier 10 may vary an amplification gain of a transmission signal according to a gain control signal. The power amplifier 20 may power-amplify an output signal of the variable gain amplifier 10. The duplexer 30 may transmit the power-amplified transmission signal to a transmission path. The current sensing circuit 100 may sense a consumed amount of current of the power amplifier 20. The baseband chip 200 may determine malfunction of a first antenna according to a sensed increased amount of current. The baseband chip 200 may also control switching to a second antenna when the first antenna is malfunctioned, and inform a user of the malfunction of the first and/or second antenna. The communication band switch 300 may selectively switch an output terminal of the duplexer 30 to the first and second antennas based on control of the baseband chip 200.

The current sensing circuit 100 may include a resister 110 connected between a terminal A (node A) and a terminal B (node B) to sense a consumed amount of current of the power amplifier 20. The current sensing circuit 100 may also include a comparator 120 for outputting a voltage level corresponding to a difference between a voltage of the node A inputted to the non-inverted input terminal and a voltage of the node B inputted to the inverted input terminal.

The voltage of the node A may be a battery voltage of the mobile station and the voltage of the node B may be a voltage resulted by subtracting the dropped amount of voltage due to the resister 110 from the battery voltage and provided to the power source voltage terminal of the power amplifier 20.

The communication band switch 300 may include a diplexer 310, a first switch 320, a second switch 330 and a fourth switch 340. The diplexer 310 may separate GSM (Global System for Mobile communication) signals and CDMA (Code Division Multiple Access) signals through a low pass filter and a high pass filter. The first switch 320 may transmit and receive the GSM signals according to a band switching control signal inputted to a band switching control terminal. The second switch 330 may transmit and receive the DCS signals according to the band switching control signal. The third switch 340 may selectively switch an output terminal of the duplexer 30 to one of the first and the second antennas according to a switching control signal of the baseband chip 200.

As shown in FIG. 3, the first antenna may be an external antenna 400 protruding from the mobile station. The second antenna may be an auxiliary antenna 500 provided inside the mobile station. Alternatively, the first antenna can be the auxiliary antenna 500 and the second antenna can be the external antenna 400.

Figure 4:
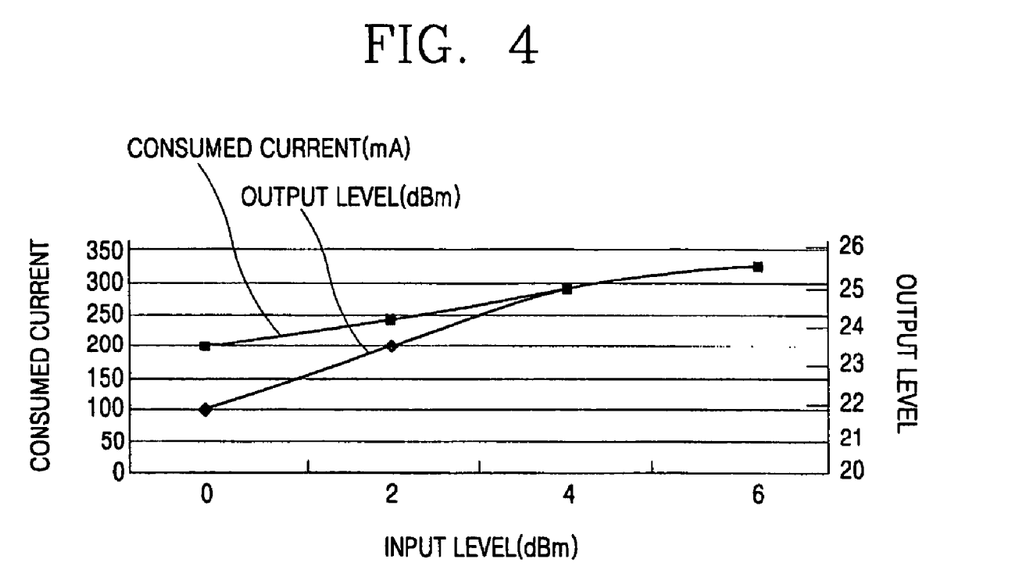
FIG. 4 is a graph showing current consumption and an output level of a power amplifier when an antenna is normally operated.

FIG. 4 is a graph showing current consumption and an output level of a power amplifier when an antenna is normally operating. If a gain control signal of a terminal 'D' is 2.5V, a matching impedance of an output terminal is 50Ω, the antenna is in a normal condition, and an input level of the power amplifier 20 is 0 dBm, a current consumed by the power amplifier 20 would be 201 mA and an output level of the power amplifier 20 would be about 21.9 dBm. For reference, 0 dBm is equivalent to 1 mW. Other values are also possible.

Figure 5:
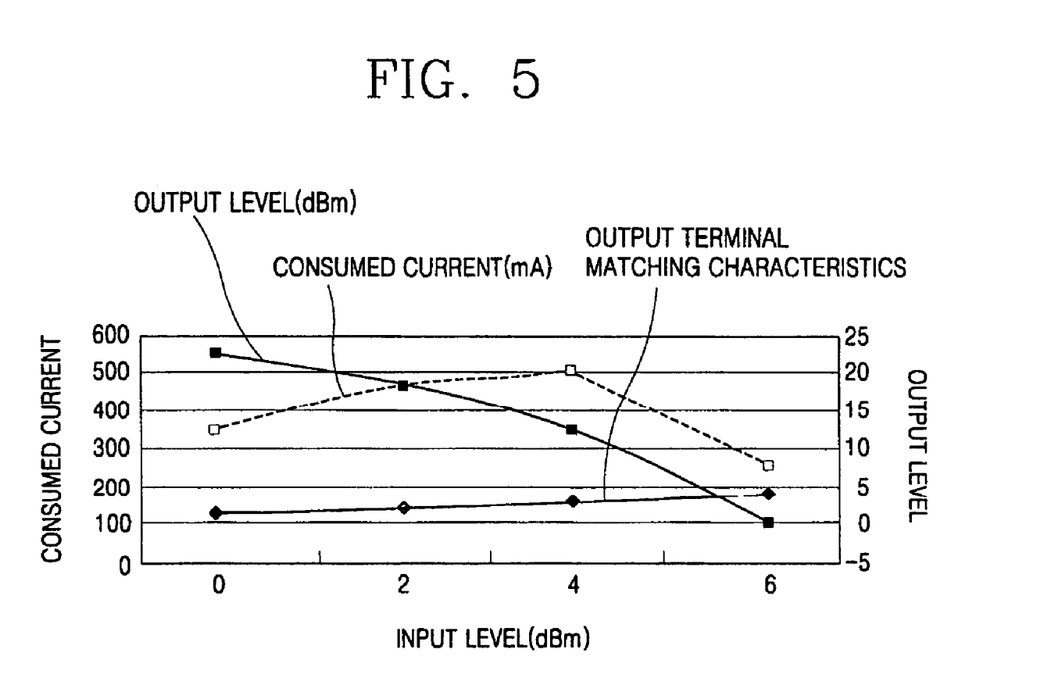
FIG. 5 is a graph showing current consumption and an output level of a power amplifier when an antenna is not normally operated.

FIG. 5 is a graph showing current consumption and an output level of a power amplifier when an antenna is not normally operated electrically. If a gain control signal of the terminal 'D' is 2.5V, a matching impedance of the output terminal is greater than 50Ω as the antenna is electrically operated in an abnormal state, and an input level of the power amplifier 20 is 0 dBm, an output level of the power amplifier is 21.9 dBm, which is the same as in the normal state, but current consumption of the power amplifier 20 is 337 mA, which is quite higher than the current consumption 201 mA when the antenna is in the normal condition. In case that the input level is 4 dBm, current consumption is increased more, increasing inefficiency in the output level and current consumption. Other values are also possible.

Therefore, whether the electrical operation of the antenna is normal or not is determined by detecting whether the current consumption of the power amplifier 20 has been increased.

Figure 6:
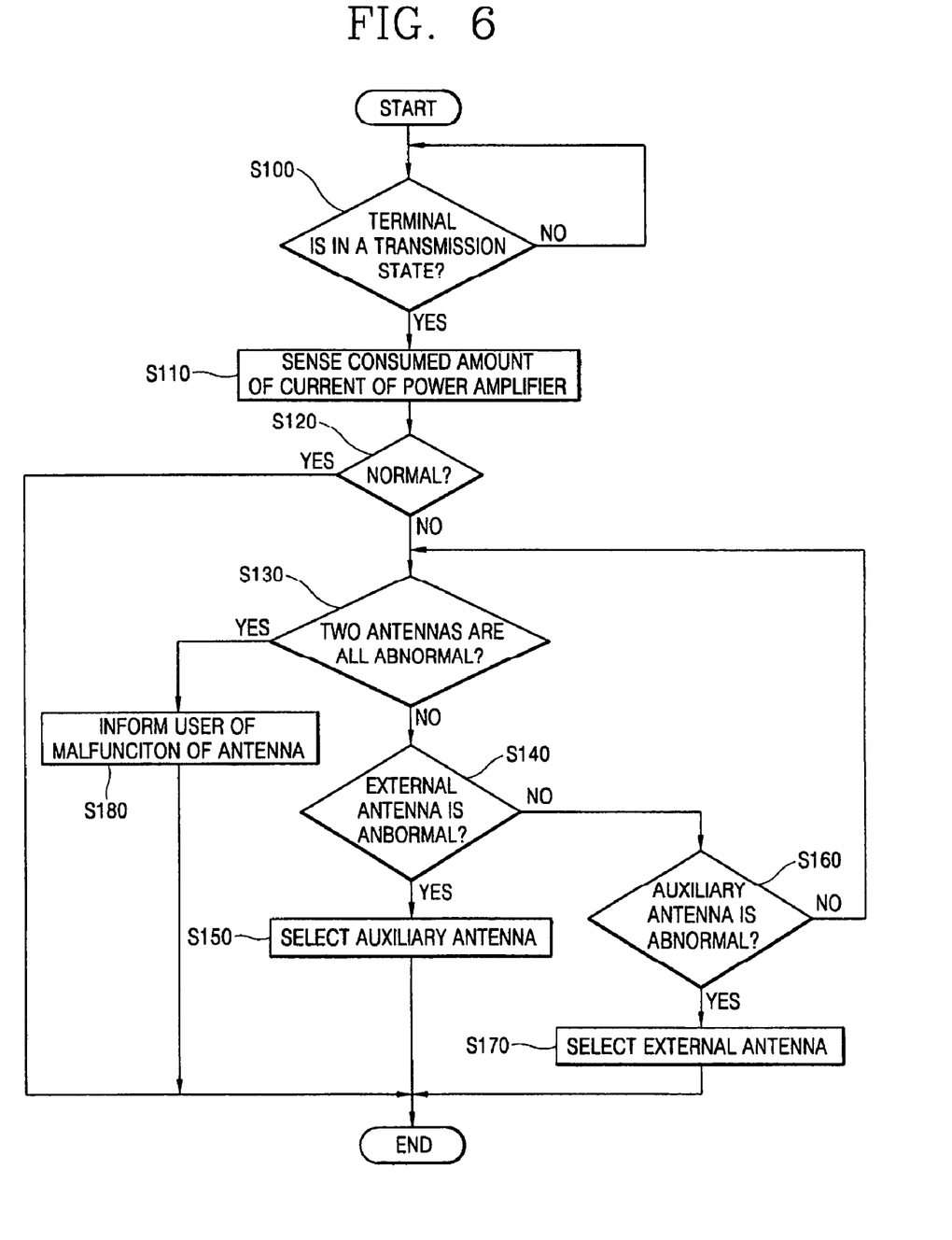
FIG. 6 is a flow chart of a method for monitoring an antenna state of a mobile station in accordance with an example embodiment of the present invention.

Operations of the apparatus for monitoring an antenna state of the mobile station will now be described. FIG. 6 is a flow chart of a method for monitoring an antenna state of a mobile station in accordance with an example embodiment of the present invention. Other embodiments, operations and orders of operations are also within the scope of the present invention.

The current sensing circuit 100 may sense the consumed amount of current of the power amplifier 20 (steps S100 and S110). The baseband chip 200 may check whether the sensed amount of current comes within an allowance range for determining a normal state. If the sensed amount of current comes within the allowance range, the baseband chip 200 may determine that the antenna is currently in a normal condition and maintain the current state of the communication band switch 300 (step S120).

However, if the sensed amount of current is not within the allowance range, the baseband chip 200 may determine that the antenna is in an electrically malfunction state and output a switching control signal to the communication band switch 300. Then, the communication band switch 300 may switch the current antenna to the other antenna according to the switching control signal.

In addition, if all the antennas of the mobile terminal are determined to be in a malfunctioned state, the baseband chip 200 may inform the user of the malfunction state of the antennas (steps S130~S170). The baseband chip 200 may also inform the user if one of the antennas is malfunctioning.

When the antenna is in a normal condition, the baseband chip 200 may store each voltage level of the terminals of the current sensing circuit 100 according to an input level of the power amplifier 20 for a specific gain control signal value. The allowance range may be determined using the stored voltage levels.

Figure 7:
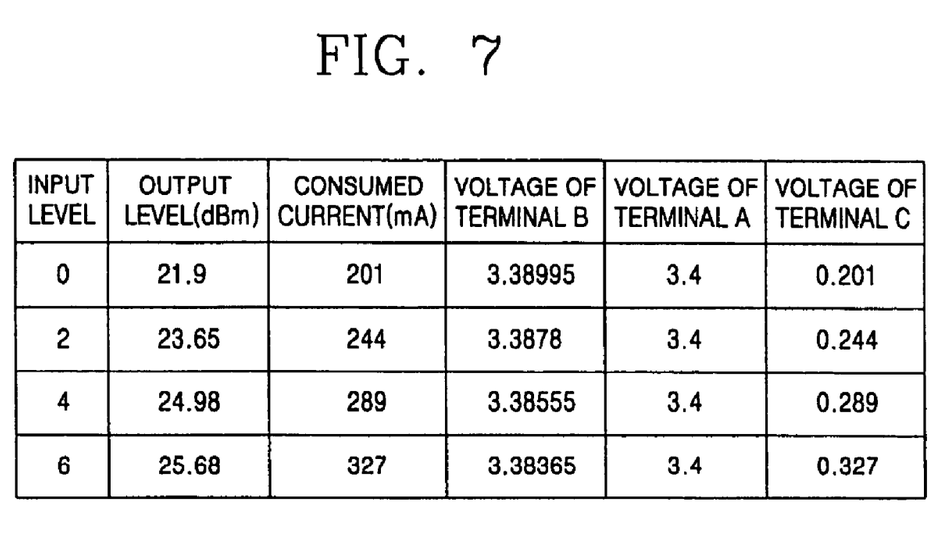
FIG. 7 illustrates current consumption and output level of the power amplifier and each terminal voltage of a current sensing circuit when the antenna is in a normal state.

FIG. 7 illustrates current consumption and output level of the power amplifier and each terminal voltage of a current sensing circuit when the antenna is in a normal state. Other values are also possible.

With reference to FIG. 3, a voltage of the terminal 'A' may be the battery voltage of the mobile station, and a voltage of the terminal 'B' may be a difference voltage between the voltage of the terminal 'A' and the amount of the voltage dropped by the resister 110, which is applied to the power source voltage of the power amplifier 20. A voltage of the terminal 'C' may be an output terminal voltage of the current sensing circuit 10, which corresponds to a difference between the voltage of the terminal 'A' and the voltage of the terminal 'B'.

The amount of current consumed by the power amplifier 20 (i.e., the amount of current flowing to the resister 110) may be measured by (the voltage of the terminal 'A'—the voltage of the terminal 'B')/resistance value.

If the gain control signal value is 2.5V, the output matching impedance may be 50Ω, the input level may be 0 dBm, then the output level of the power amplifier 20 is 21.9 dBm, the current consumption of the power amplifier 20 is 201 mA, the voltage of the terminal 'A' of the current sensing circuit 100 is 3.4V, the voltage of the terminal 'B' is 3.38995V, and the voltage of the terminal 'C' is 0.201V. Again, other values are also possible.

When the antenna is operating normally, the baseband chip 200 may store a consumed current and an output level according to an input level of the power amplifier 20 and each voltage of the terminals A, B and C of the current sensing circuit 100, for a specific gain control signal value.

The baseband chip 200 may determine an allowance range for determining a normal state for the voltage of the terminal 'C' according to each stored input level.

Figure 8:
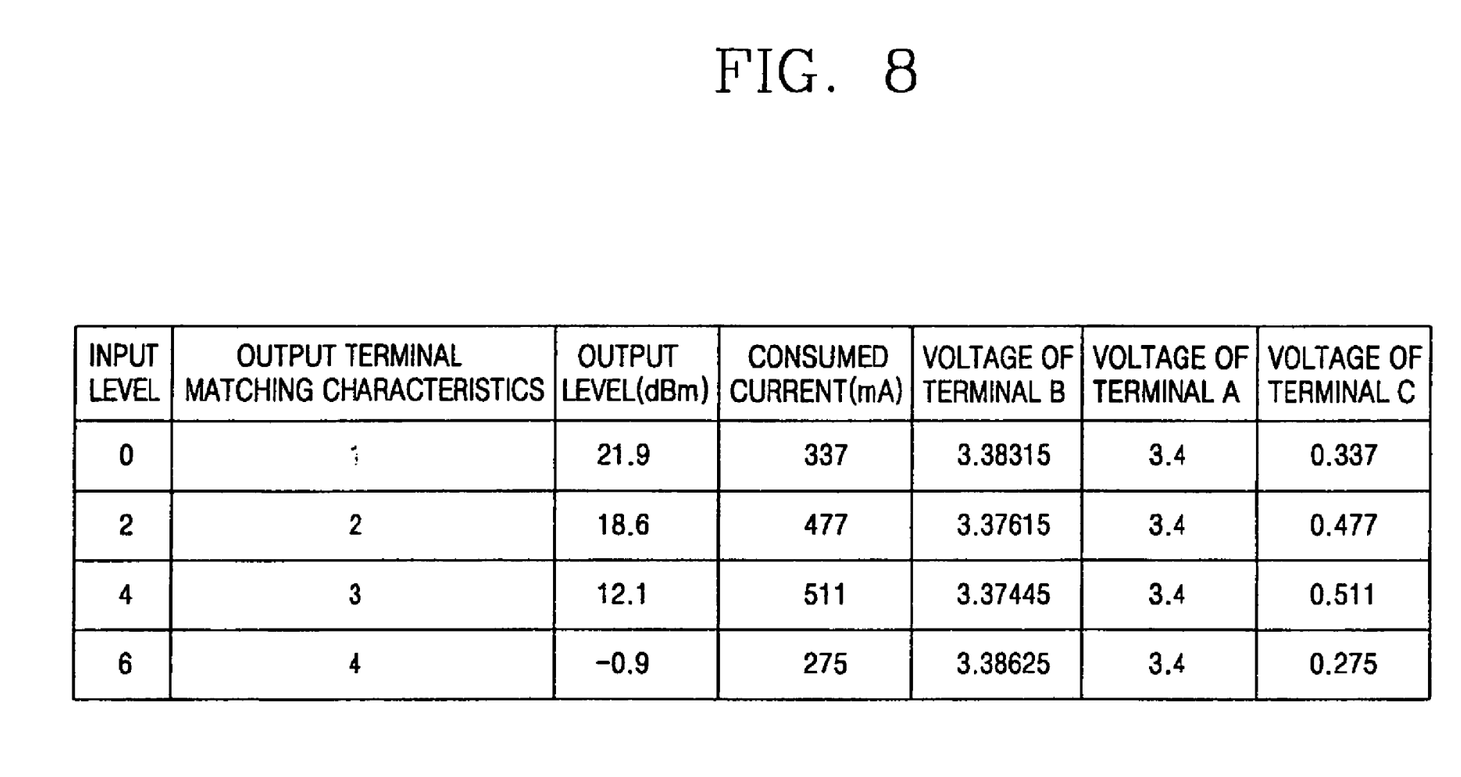
FIG. 8 illustrates current consumption and output level of the power amplifier and each terminal voltage of the current sensing circuit when the antenna is in an electrically abnormal state.

FIG. 8 illustrates current consumption and output level of the power amplifier and each terminal voltage of the current sensing circuit when the antenna is in an electrically abnormal state.

If an output matching impedance exceeds 50Ω as the antenna is in an electrically abnormal state, the gain control signal value is 2.5V and the input level is 4 dBm, then the consumed amount of current of the power amplifier 20 is 511 mA, which is much higher than 289 mA in the normal state.

When the mobile station is in a transmission state, the current sensing circuit 100 may sense the consumed amount of current of the power amplifier 20 (steps S100 and S110). That is, the battery voltage of the mobile station may be applied to the power source voltage terminal of the power amplifier 20, and at this time, the current sensing circuit 100 provided on the line to which the battery voltage is applied may sense the amount of current flowing at the line to thereby sense a consumed amount of the current of the current amplifier 20. The current sensing circuit 100 may then output a voltage level corresponding to the amount of current flowing at the resister 110 provided on the line through the output terminal of the comparator 120.

The baseband chip 200 may check whether the level of the voltage outputted from the current sensing circuit 100 is within the allowance range of the corresponding voltage level according to the input level of the power amplifier 20. In addition, the baseband chip 200 may check both the current switching state of the communication band switch 300 and the state information of another antenna that is not currently connected.

For example, in a state that an output terminal of the duplexer 30 is connected to the terminal 4 (FIG. 3) of the external antenna 400, if the input level of the power amplifier 20 is 4 dBm and the voltage outputted from the current sensing circuit 100 is 0.289V, the baseband chip 200 may determine that the antenna is currently within the allowance range for determining a normal state and maintain the current state of the switching state of the communication band switch 300 (step S120).

However, if the state information of the other antenna, which is not connected currently, shows a normal state and the level of the voltage outputted from the current sensing circuit 100 is not within the allowance range of the corresponding voltage level, the baseband chip 220 may determine that the currently connected antenna is in an electrically malfunction state.

For example, if the input level is 4 dBm and the voltage of the terminal 'C' of the current sensing circuit 100 is 0.511V, the baseband chip 200 may determine that the antenna is not currently within the allowance range for determining a normal state and output a switching control signal to the communication band switch 300 through the terminal E.

If the output terminal of the duplexer 30 and the terminal 4 (FIG. 3) of the external antenna 400 are coupled to each other, the state information of the other antenna that is not currently connected indicates a normal state, and the level of the voltage outputted from the current sensing circuit 100 is not within the allowance range, then the baseband chip 200 may determine that the external antenna 400 is in an electrically abnormal state and output a high level switching control signal (steps S140 and S150).

If the output terminal of the duplexer 30 and the terminal 5 (FIG. 3) of the internal auxiliary antenna 500 are coupled to each other, the state information of the other antenna that is not currently connected indicates a normal state, and the level of the voltage outputted from the current sensing circuit 100 is not within the allowance range, then the baseband chip 200 may determine that the auxiliary antenna 500 is in an electrically abnormal state and output a low level switching control signal (steps S140, S160 and S170).

Figure 9:
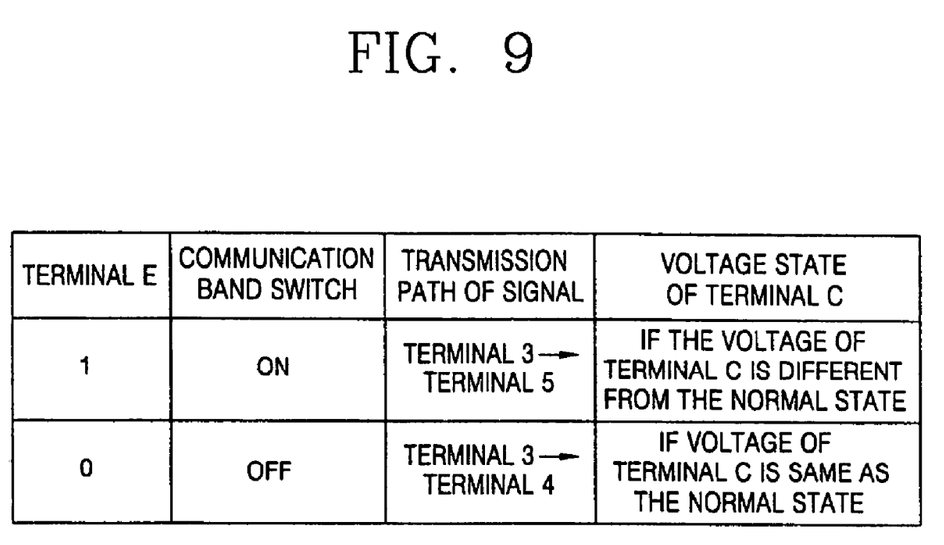
FIG. 9 illustrates an antenna switching operation of a communication band switch based on control of a baseband chip.

FIG. 9 illustrates an example of a switching operation of the communication band switch 300 according to the switching control signal. For example, if the switching control signal output from the baseband chip 200 has a high level, the third switch 340 of the communication band switch 30 connects the output terminal of the duplexer 30 to the terminal 5 of the internal auxiliary antenna 500. Accordingly, the output signal of the power amplifier 20 is transmitted through the terminal 3 to the terminal 5.

If the switching control signal has a low level, the third switch 340 of the communication band switch 300 connects the output terminal of the duplexer 30 to the terminal 4 of the external antenna 400. Accordingly, the output signal of the power amplifier 20 is transmitted through the terminal 3 to the terminal 4.

Meanwhile, if the state information of the other antenna that is not currently connected indicates an abnormal state and the level of the voltage outputted from the current sensing circuit 100 is not within the allowance range of the corresponding voltage level, the baseband chip 200 determines that the external antenna 400 and the auxiliary antenna 500 are all in the abnormal state and inform the user of the abnormal state of the antennas through the terminal F (steps S130 and S180). Then, the user can take a step upon recognition of the abnormal state of the antennas.

The apparatus and method for monitoring an antenna state of a mobile station of the present invention may have many advantages.

The amount of current flowing on the line applied when the battery voltage is applied to the power source voltage terminal of the power amplifier may be measured to sense whether the consumed amount of current of the power amplifier has been increased or not, in order to detect an electrically abnormal state of the antenna and control switching to a normal antenna. This may be performed so that the performance of the output terminal of the mobile station can be enhanced and the battery consumption amount can be reduced. This may avoid shortening of a life span of the battery.

In addition, in the mobile station without having an isolator, since switching to a normal antenna is controlled by detecting the electrically abnormal operation state of the antenna, an output level degradation of the terminal may be prevented and thus the performance of the output terminal is improved. Since an excessive consumption of the battery voltage by the power amplifier may be prevented, the life span of the battery can be lengthened.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus for monitoring an antenna of a mobile station comprising:
   a current sensing circuit to sense a current consumption amount of a power amplifier that amplifies a transmission signal;
   a baseband chip to determine malfunction of a first antenna based on the sensed current, the baseband switch to control switching to a second antenna when the first antenna is determined to be malfunctioned; and
   a communication band switch to selectively switch the transmission signal from the first antenna to the second antenna based on the baseband chip, wherein the communication band switch includes:
      a first switch to transmit or receive first signals based on a band control signal;
      a second switch to transmit or receive second signals based on a band control signal; and
      a third switch to select between the first antenna and the second antenna based on a signal from the baseband chip, the third switch to apply a power amplified signal to the selected first or second antenna.

2. The apparatus of claim 1, wherein the baseband chip further informs a user of antenna malfunction when at least one of the antennas malfunctions.

3. The apparatus of claim 1, wherein the current sensing circuit comprises:
   a resister coupled between a node 'A' and a node 'B', the node 'A' coupled to a battery voltage terminal and the node 'B' coupled to a power source voltage terminal of the power amplifier, the resistor to sense the current consumption amount of the power amplifier; and
   a comparator to output a voltage level corresponding to a voltage difference between a voltage of the node 'A' and a voltage of the node 'B'.

4. The apparatus of claim 3, wherein the voltage of the node 'A' is input to a non-inverted input terminal of the comparator and the voltage of the node 'B' is input to an inverted input terminal of the comparator.

5. The apparatus of claim 1, wherein the baseband chip determines malfunction when the sensed current increases.

6. The apparatus of claim 5, wherein if the increased amount of current is not within a tolerance range for determining a normal state of the antenna, the baseband chip determines that the first antenna is in an electrically malfunction state.

7. The apparatus of claim 1, wherein the communication band switch further includes:

a duplexer to separate the first signals and the second signals by low pass filtering and high pass filtering.

8. The apparatus of claim 1, wherein the first antenna comprises an antenna that is currently connected to a transmission path of the transmission signal, and the second antenna comprises a preliminarily provided antenna.

9. The apparatus of claim 1, wherein the first antenna comprises an external antenna.

10. The apparatus of claim 1, wherein the second antenna comprises an external antenna.

11. An apparatus for monitoring an antenna of a mobile station comprising:
 a resister coupled between a battery voltage terminal and a power source voltage terminal of a power amplifier to sense a current consumption amount of the power amplifier;
 a comparator to detect a voltage level corresponding to an amount of voltage drop due to the resister;
 a baseband chip to determine that the antenna connected to a current transmission path is in an electrically malfunction state based on the detected voltage level; and
 a band switch to switch a signal between the first antenna and another antenna, wherein the band switch includes:
  a first switch to transmit or receive first signals based on a band control signal;
  a second switch to transmit or receive second signals based on a band control signal; and
  a third switch to select between the antenna and the another antenna based on a signal from the baseband chip, the third switch to apply a power amplified signal to the selected antenna.

12. The apparatus of claim 11, wherein if the antenna is determined to be in a malfunction state, the baseband chip generates a switching control signal to switch the current transmission path to the another antenna.

13. The apparatus of claim 12, wherein if the antenna is determined to be in the malfunction state and the another antenna is in an electrically malfunction state, the baseband chip informs a user of the abnormal operation of the antennas.

14. The apparatus of claim 11, wherein the baseband chip determines that the antenna is in the electrically malfunction state based on an increased voltage level.

15. The apparatus of claim 11, wherein the band switch further includes:
 a duplexer to separate the first signal and the second signal by filtering.

16. A mobile terminal, comprising:
 a first device to determine a state of a first antenna; and
 a second device to switch to operation of a second antenna based on the determination of the first device, wherein the second device includes:
  a duplexer to separate first signals and second signals by filtering;
  a first switch to transmit and receive the first signals according to a band switching control signal;
  a second switch to transmit and receive the second signal according to the band switching control signal; and
  a third switch to switch a power-amplified transmission signal to one of the first antenna and the second antenna based on a switching control signal of a baseband chip.

17. The mobile terminal of claim 16, wherein the first device comprises:
 a circuit to sense current consumption of an amplifier; and
 a chip to determine the state of the first antenna based on the sensed current.

18. The mobile terminal of claim 17, wherein the second device switches to operation of the second antenna when the first antenna is determined to be malfunctioning.

19. The mobile terminal of claim 17, wherein the circuit comprises:
 a resister coupled between a node 'A' and a node 'B', the node 'A' coupled to a battery voltage terminal and the node 'B' coupled to a power source voltage terminal of an amplifier, the resistor to sense the current consumption amount of the amplifier; and
 a comparator to output a voltage level corresponding to a voltage difference between a voltage of the node 'A' and a voltage of the node 'B'.

* * * * *